(12) United States Patent
Ozawa (10) Patent No.: US 8,008,777 B2
(45) Date of Patent: Aug. 30, 2011

(54) METHOD FOR MANUFACTURING SEMICONDUCTOR DEVICE AND THE SEMICONDUCTOR DEVICE

(75) Inventor: Ken Ozawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/457,153

(22) Filed: Jun. 2, 2009

(65) Prior Publication Data

US 2009/0315186 A1 Dec. 24, 2009

(30) Foreign Application Priority Data

Jun. 20, 2008 (JP) .................... 2008-161641

(51) Int. Cl.
*H01L 23/52* (2006.01)
*H01L 23/528* (2006.01)
*H01L 23/532* (2006.01)
*H01L 21/768* (2006.01)

(52) U.S. Cl. .......... 257/760; 257/774; 257/E23.167; 257/E23.154; 257/E23.151; 438/637

(58) Field of Classification Search ............ 438/637; 257/760, 774, E23.142, E23.151, E23.154, 257/E23.167

See application file for complete search history.

(56) References Cited

U.S. PATENT DOCUMENTS

| | | | | |
|---|---|---|---|---|
| 6,072,227 A * | 6/2000 | Yau et al. | ...................... | 257/642 |
| 6,225,211 B1 * | 5/2001 | Tsui | ............................. | 438/624 |
| 6,268,279 B1 | 7/2001 | Okada | | |
| 6,323,118 B1 * | 11/2001 | Shih et al. | ...................... | 438/624 |
| 6,368,967 B1 * | 4/2002 | Besser | ......................... | 438/687 |
| 6,511,909 B1 * | 1/2003 | Yau et al. | ....................... | 438/638 |
| 6,537,929 B1 * | 3/2003 | Cheung et al. | ................ | 438/790 |
| 6,573,148 B1 * | 6/2003 | Bothra | .......................... | 438/381 |
| 6,582,974 B2 * | 6/2003 | Lui et al. | ............................ | 438/6 |
| 6,624,053 B2 * | 9/2003 | Passemard | ..................... | 438/584 |
| 6,649,531 B2 * | 11/2003 | Cote et al. | ...................... | 438/714 |
| 6,828,229 B2 * | 12/2004 | Lee et al. | ...................... | 438/638 |
| 7,091,137 B2 * | 8/2006 | Lee et al. | ...................... | 438/778 |
| 7,135,398 B2 * | 11/2006 | Fitzsimmons et al. | ........ | 438/618 |
| 7,618,887 B2 * | 11/2009 | Bae | .................................. | 438/622 |
| 7,675,175 B2 * | 3/2010 | Tokitoh et al. | ................ | 257/758 |
| 7,741,222 B2 * | 6/2010 | You et al. | ....................... | 438/700 |
| 7,763,979 B2 * | 7/2010 | Ohto et al. | ..................... | 257/759 |
| 2002/0000670 A1 * | 1/2002 | Yau et al. | ....................... | 257/759 |
| 2008/0164617 A1 * | 7/2008 | Assefa et al. | ................. | 257/774 |

FOREIGN PATENT DOCUMENTS

| JP | 11-345875 A | 12/1999 |
|---|---|---|
| JP | 2004-140151 | 5/2004 |
| JP | 2007-81284 A | 3/2007 |

\* cited by examiner

*Primary Examiner* — Mary Wilczewski
(74) *Attorney, Agent, or Firm* — McGinn IP Law Group, PLLC (57) ABSTRACT

An etching stopper film is formed on top of a first insulating film. The etching stopper film is a film formed by depositing at least two films, made of constituent materials identical in quality to each other, one another. Subsequently, a first opening pattern is formed in the etching stopper film. Subsequently, a second insulating film is formed on top of the etching stopper film. Subsequently, a mask pattern is formed on top of the second insulating film. Subsequently, the second insulating film is etched with the use of the mask pattern as a mask to be followed by etching of the first insulating film with the use of the etching stopper film as a mask.

8 Claims, 6 Drawing Sheets

METHOD FOR MANUFACTURING SEMICONDUCTOR DEVICE AND THE SEMICONDUCTOR DEVICE

FIELD OF THE INVENTION

The invention relates to a method for manufacturing a semiconductor device, which includes the step of forming a groove and a via hole, and the semiconductor device manufactured by the method.

BACKGROUND OF THE INVENTION

A dual damascene process whereby both an interconnect groove and a via hole are formed in an interlayer dielectric, and subsequently, multi-level interconnects are formed by concurrently embedding a metal film in the interconnect groove, and the via hole, respectively, the dual damascene process has an advantage in that manufacturing cost can be considerably reduced because of reduction in the number of steps of processing. The dual damascene process includes a process shown in, for example, JP-A No. 11 (1999)-345875, JP-A No. 2004-140151, and JP-A No. 2007-081284, respectively, by way of example. With the process, an etching stopper film between interconnect layers in a region for a via is first worked on to thereby form an insulating film between the interconnect layers, and subsequently, an interlayer dielectric is etched, thereby concurrently forming an interconnect groove and a via hole.

SUMMARY OF THE INVENTION

Figure 5A:
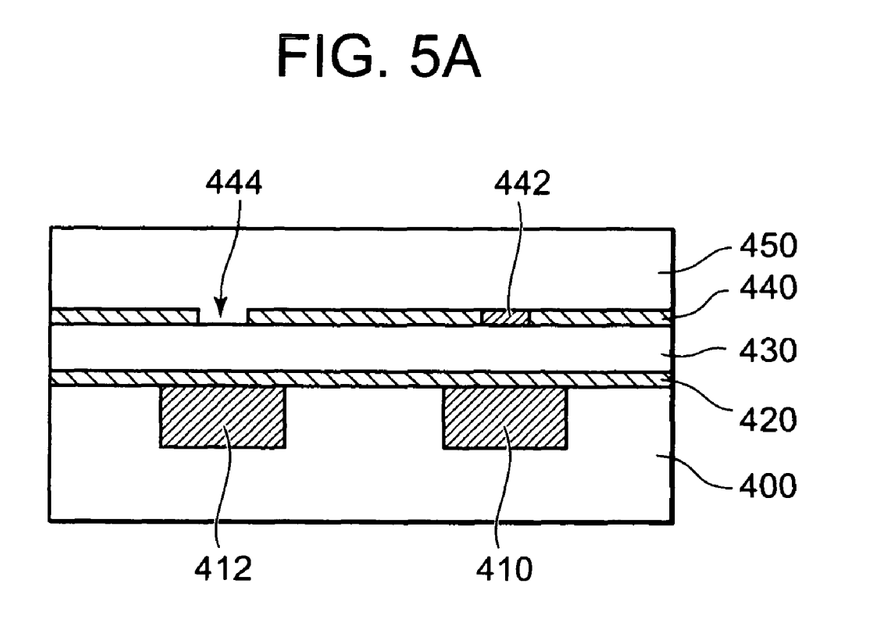
FIGS. 5A, 5B each are a sectional view for describing a problem to be solved by the present invention.

FIGS. 5A, 5B, 6A, and 6B each are a view for describing a problem encountered by the process shown in those Patent Documents described as above, respectively, by way of example. As shown in FIG. 5A, interconnects 410, 412 are first formed in the surface of an insulating film 400. Subsequently, an etching stopper film 420, a via interlayer dielectric 430, an etching stopper film 440, and an interconnect interlayer dielectric 450 are deposited in that order on top of the interconnects 410, 412, respectively. An opening pattern 444 positioned above the interconnect 410 is formed in the etching stopper film 440. In this connection, there can be a case where a high etching rate region 442 is formed due to, for example, deposition of particles, and abnormality in film quality when the etching stopper film 440 is formed.

Figure 5B:
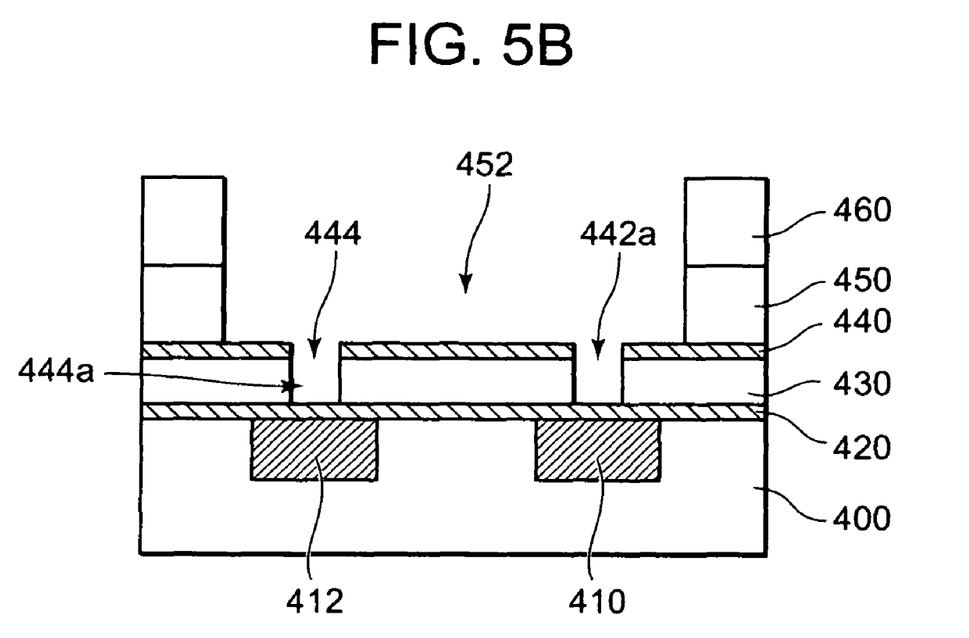

Subsequently, a mask pattern 460 is formed on top of the interconnect interlayer dielectric 450 as shown in FIG. 5B, and etching is applied with the use of the mask pattern 460 as a mask. By so doing, an interconnect groove 452 is formed in the interconnect interlayer dielectric 450, and a connection hole 444a positioned below the opening pattern 444 is formed in the via interlayer dielectric 430. When the high etching rate region 442 is formed in the etching stopper film 420, there can be a case where the high etching rate region 442 as well is removed. In such a case, there are times when a pin hole 442a positioned below the high etching rate region 442 is formed in the via interlayer dielectric 430.

Figure 6A:
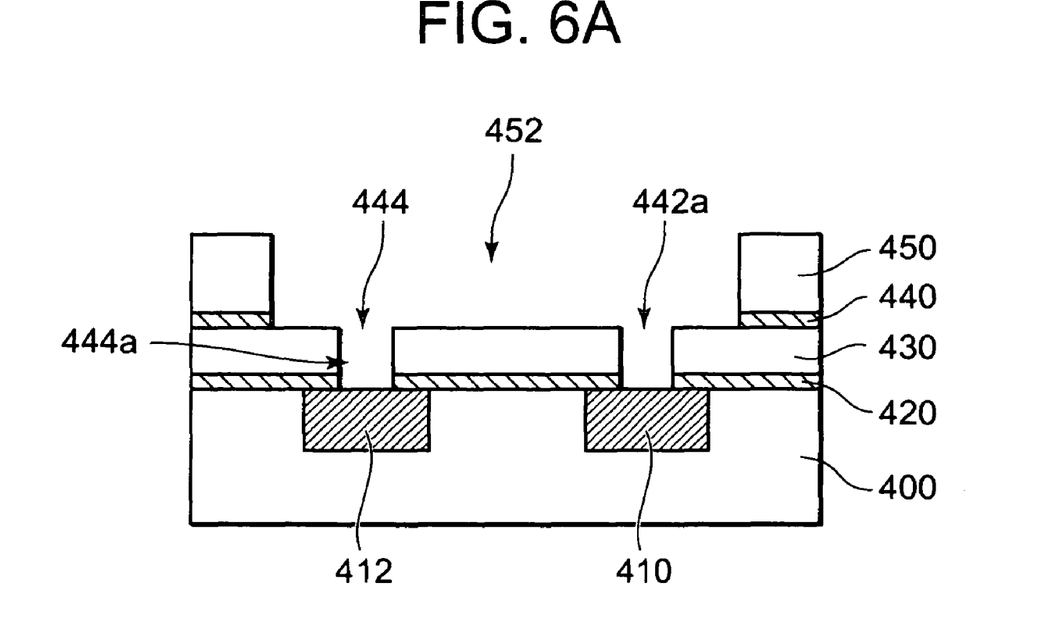
FIGS. 6A, 6B each are a sectional view for describing the problem to be solved by the present invention.

Thereafter, portions of the etching stopper film 440, positioned at the bottom of the interconnect groove 452, and a portion of the etching stopper film 420, positioned at the bottom of the connection hole 444a, are removed as shown in FIG. 6A. In case the pin hole 442a is formed, a portion of the etching stopper film 420, positioned at the bottom of the pin hole 442a, is also removed.

Figure 6B:
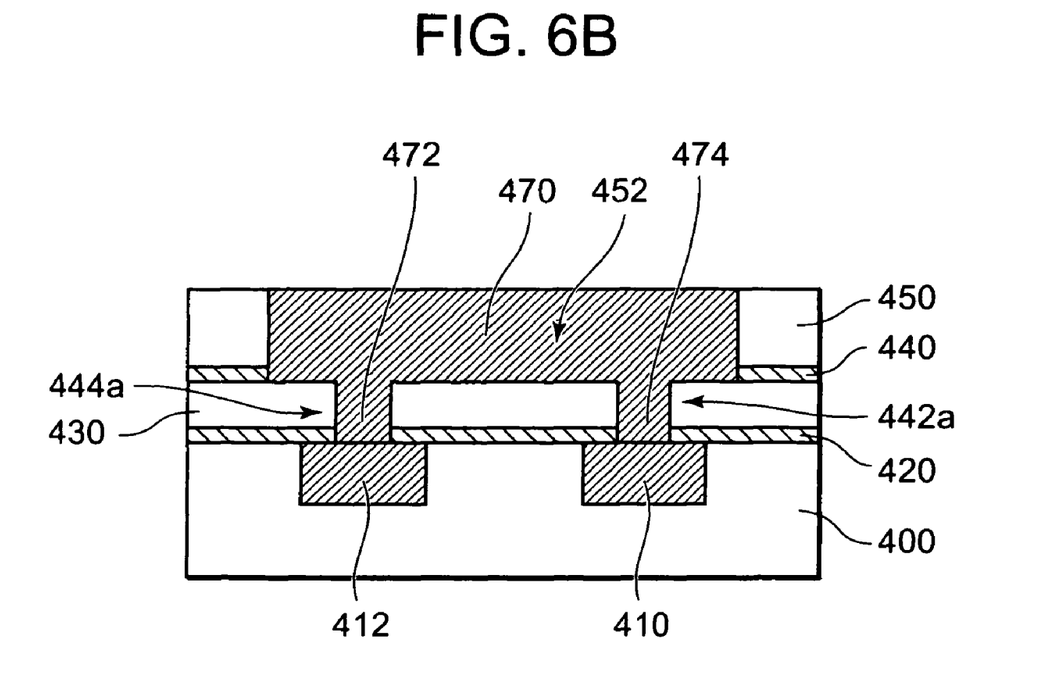

Subsequently, an electric conductor is embedded into the interconnect groove 452, and the connection hole 444a, respectively, as shown in FIG. 6B. By so doing, an interconnect 470, and a via 472 are formed. In case the pin hole 442a is formed, the electric conductor is embedded into the pin hole 442a as well, whereupon a via 474 is formed. In this case, the interconnect 470 will come to be short-circuited with the interconnect 410 through the via 474.

Thus, with the process described in those patent documents described above, respectively, if a region low in etching resistance is formed in an etching stopper film positioned between a first insulating film (e.g., the via interlayer dielectric), and a second insulating film (e.g., the interconnect interlayer dielectric), there have been encountered a case where an unintended pin hole is formed below the region. For this reason, there has been a high hope for a technology whereby the formation of the unintended pin hole can be prevented even if a region low in etching resistance is formed in the etching stopper film.

According to one aspect of the invention, a method for manufacturing a semiconductor device includes the steps of forming a first insulating film, forming an etching stopper film made up of at least two films made of constituent materials identical in quality to each other, respectively, and deposited one another, on top of the first insulating film, forming a first opening pattern in the etching stopper film, forming a second insulating film over the etching stopper film, and inside the opening pattern, respectively, forming a mask pattern having a second opening pattern positioned above the first opening pattern over the second insulating film, and etching the second insulating film with the use of the mask pattern as a mask to be followed by etching of the first insulating film with the use of the etching stopper film as a mask, thereby forming a groove positioned in the second insulating film, and a hole positioned in the first insulating film, extended downward from the bottom of the groove.

With the present embodiment, the etching stopper film is formed by depositing at least two films, made of constituent materials identical in quality to each other, respectively, one another. Even if regions low in etching resistance are formed in those two films, respectively, a probability of those regions overlapping each other is low. For this reason, an unintended pinhole can be prevented from being formed in the first insulating film in the step of forming the groove and the hole even if the region low in etching resistance is formed in the etching stopper film.

According to another aspect of the present invention, a semiconductor device includes a first electrically conductive pattern, a first interlayer dielectric positioned over the first electrically conductive pattern, an etching stopper film made up of at least two films made of constituent materials identical in quality to each other, respectively, deposited one another, positioned on top of the first interlayer dielectric, a second interlayer dielectric positioned over the etching stopper film, an interconnect groove formed in the second interlayer dielectric, and positioned above the first electrically conductive pattern, a portion of the etching stopper film, being exposed to the bottom of the interconnect groove, a connection hole formed in the first interlayer dielectric, and the etching stopper film, in such a way as to connect the underside of the interconnect groove to the first electrically conductive pattern, and a second electrically conductive pattern embedded in the connection hole, and the interconnect groove.

With the present invention, even if a region low in etching resistance is formed in the etching stopper film formed on top of the first interlayer dielectric, it is possible to prevent an unintended pin hole from being formed in the first interlayer dielectric.

DETAILED DESCRIPTION OF THE PREFERRED EMBODIMENTS

Embodiments of the present invention are described hereinafter with reference to the accompanying drawings. In all the drawings, constituent elements identical to each other are denoted by like reference numerals, thereby omitting description thereof as appropriate.

FIGS. 1A, 1B to 4A, 4B each are a sectional view showing a method for manufacturing a semiconductor device, according to an embodiment of the present invention. The method for manufacturing a semiconductor device includes the following steps. First, a first insulating film (a via interlayer dielectric) 220 is formed. Subsequently, an etching stopper film 230 is formed on top of the first insulating film 220. The etching stopper film 230 is a film formed by depositing at least two films 232, 234, made of constituent materials identical in quality to each other, in that order. Subsequently, a first opening pattern 230a is formed in the etching stopper film 230. Subsequently, a second insulating film (an interconnect interlayer dielectric) 240 is formed on top of the etching stopper film 230. Subsequently, a mask pattern 52 is formed on top of the second insulating film 240. The mask pattern 52 has a second opening pattern 52a positioned above the first opening pattern 230a. Then, the second insulating film 240 is etched with the use of the mask pattern 52 as a mask to be followed by etching of the first insulating film 220 with the use of the etching stopper film 230 as a mask. By so doing, there are formed a groove 242 positioned in the second insulating film 240, and a hole (connection hole) 220a positioned in the first insulating film 220, extended downward from the bottom of the groove 242. Further description in more detail is given hereinafter.

Figure 1A:
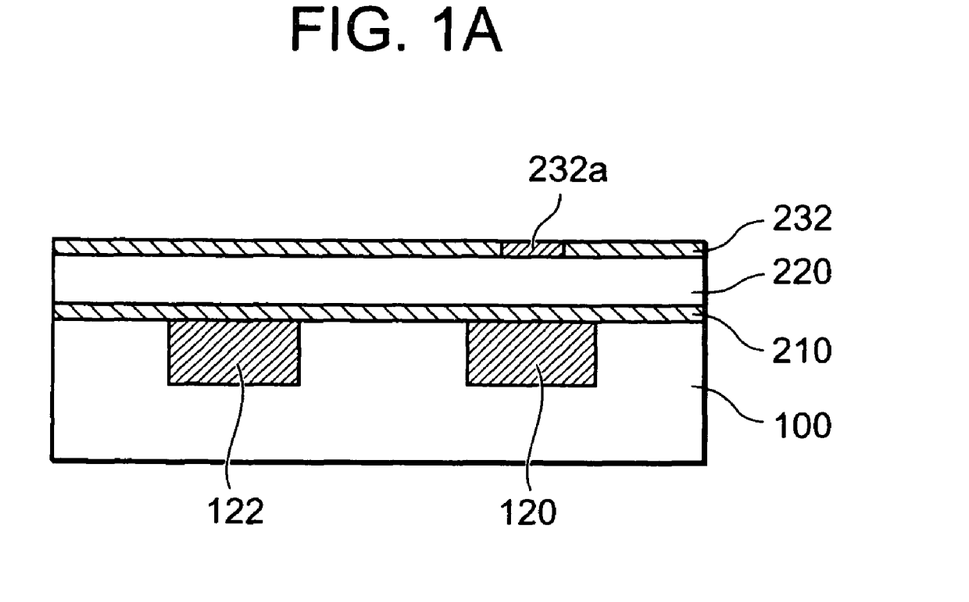
FIGS. 1A, 1B each are a sectional view showing a method for manufacturing a semiconductor device, according to an embodiment of the present invention.

First, interconnects 120, 122 are formed in the surface of an interlayer dielectric 100, as shown in FIG. 1A. The interlayer dielectric 100 is formed on top of a substrate (not shown) such as a semiconductor substrate, and so forth. Transistors (not shown) are formed on the substrate. With an example shown in the figure, the interconnects 120, 122 each are a Cu interconnect, and are embedded in the interlayer dielectric 100. Voltages (signals) differing from each other are inputted to the interconnects 120, 122, respectively. The interconnect 120 is, for example, a grounding interconnect, and the interconnect 122 is, for example, an interconnect through which a signal (VDD) is inputted to a gate electrode of a transistor.

Subsequently, an etching stopper film 210 is formed on top of the interlayer dielectric 100, and the interconnects 120, 122, respectively, by a CVD method. The etching stopper film 210 is, for example, an SiCN film, or an SiON film. A composition of any of those films is optional. Subsequently, the via interlayer dielectric 220 is formed on top of the etching stopper film 210 by the CVD method. The via interlayer dielectric 220 is, for example, a silicon oxide film, or a low-permittivity insulating film lower in permittivity than the silicon oxide film. For the low-permittivity insulating film, use can be made of an insulating film having permittivity, for example, not more than 3.3, preferably not more than 2.9. For the low-permittivity insulating film, use can be made of not only SiOC but also poly (hydrogen siloxane) such as HSQ (hydrogen silsesquioxane), MSQ (methyl silsesquioxane), or MHSQ (methyl hydrogen silsesquioxane), an aromatic organic material such as poly (allyl ether) (PAE), divinylsiloxane-bis-benzocyclobutene (BCB), or Silk (registered trademark), and so forth, SOG, FOX (flowable oxide), CYTOP, or BCB (Bensocyclobutene), and so forth. Further, for the low-permittivity insulating film, use can also be made of a porous film thereof.

Subsequently, a first film 232 is formed on top of the via-interlayer dielectric 220 by the CVD method. The first film 232 is, for example, an SiCN film, or an SiON film. A composition of any of those films is optional. In this process step, there can be a case where a high etching rate region 232a is formed in the first film 232 due to, for example, particle deposition thereon, and abnormality in film quality.

Figure 1B:
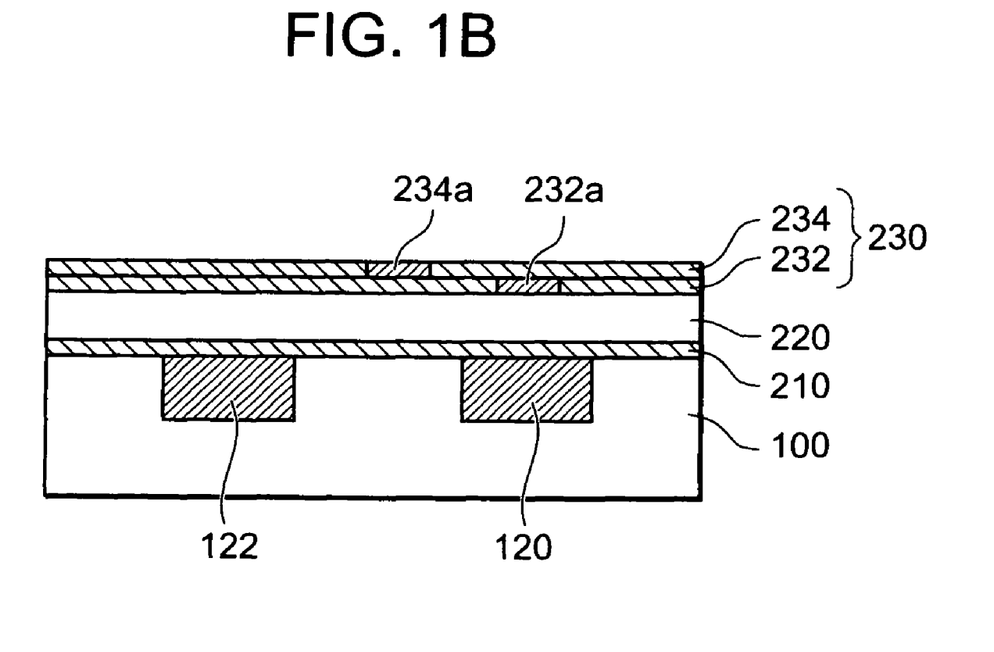

Subsequently, as shown in FIG. 1B, a semiconductor device is taken out of a film-forming unit after the first film 232 is formed, and thereafter, the semiconductor device is again brought into the film-forming unit. Thereafter, a second film 234 is formed on top of the first film 232 by the CVD method. The etching stopper film 230 comprised of the first film 232 and the second film 234 is formed in this way. The second film 234 is made of material identical in quality to the first film 232. The second film 234 is preferably identical in composition to the first film 232, but may differ in composition from the first film 232. The respective compositions of the first film 232 and the second film 234 can be adjusted by, for example, changing a ratio of a source gas, or by changing the source gas itself. In this process step, there can be a case where a high etching rate region 234a is formed in the second film 234, due to, for example, particle deposition thereon, and abnormality in film quality. However, a possibility of the high etching rate regions 232a, 234a overlapping each other is low.

The first film 232 is exposed to the atmosphere before the formation of the second film 234. Accordingly, there can be a case where a natural oxidation film is formed on the surface of the first film 232 before the formation of the second film 234 after the formation of the first film 232. In such a case, the second film 234 is formed on top of the natural oxidation film of the first film 232

Figure 2A:
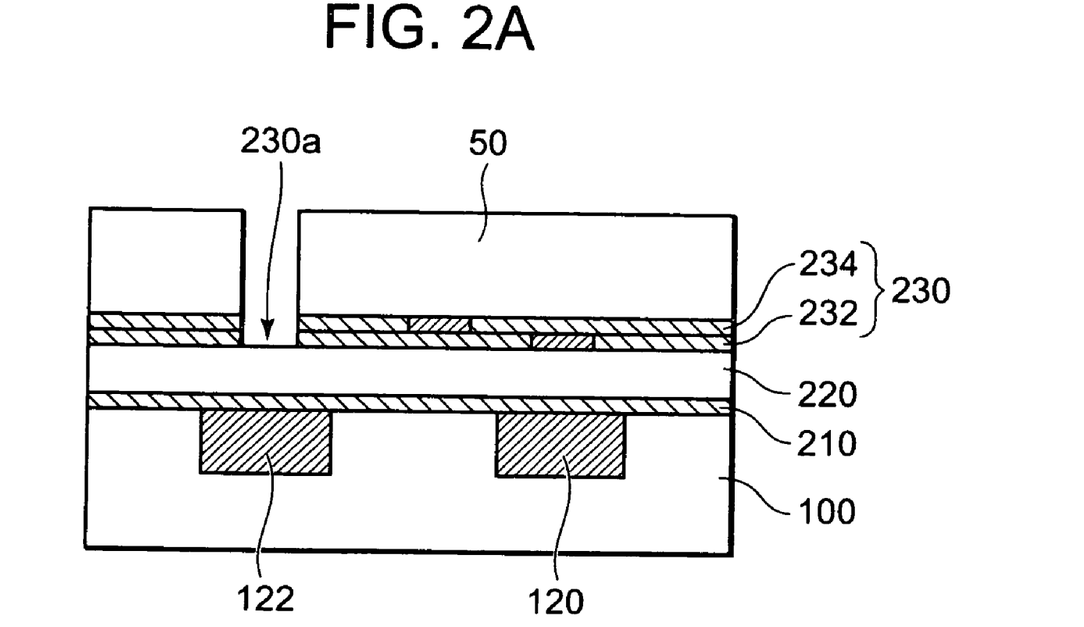
FIGS. 2A, 2B each are a sectional view showing the method for manufacturing a semiconductor device, according to the embodiment of the present invention.

Subsequently, the mask pattern 50 is formed on top of the etching stopper film 230, as shown in FIG. 2A, and the etching stopper film 230 is etched with the use of the mask pattern 50 as a mask. By so doing, the opening pattern 230a is formed in the etching stopper film 230. The opening pattern 230a is positioned above the interconnect 122.

Figure 2B:
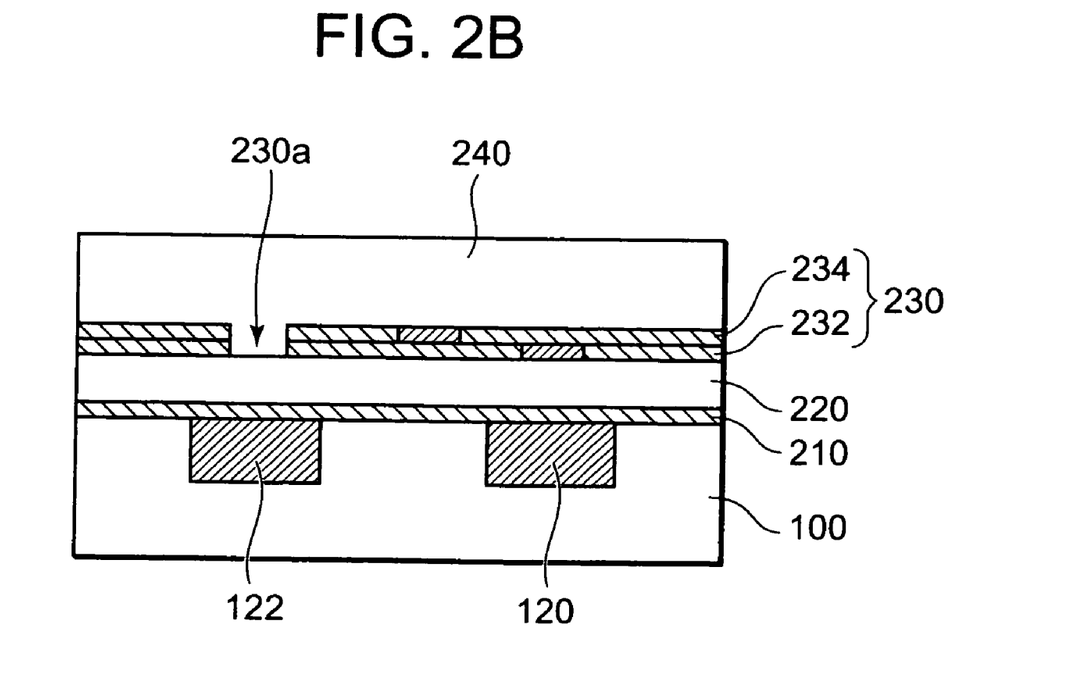

Thereafter, the mask pattern 50 is removed as shown in FIG. 2B. Subsequently, the interconnect interlayer dielectric 240 is formed over the etching stopper film 230, and inside the opening pattern 230a, respectively, by the CVD method. The interconnect interlayer dielectric 240 is, for example, a silicon oxide film, or the low-permittivity insulating film described as above.

Figure 3A:
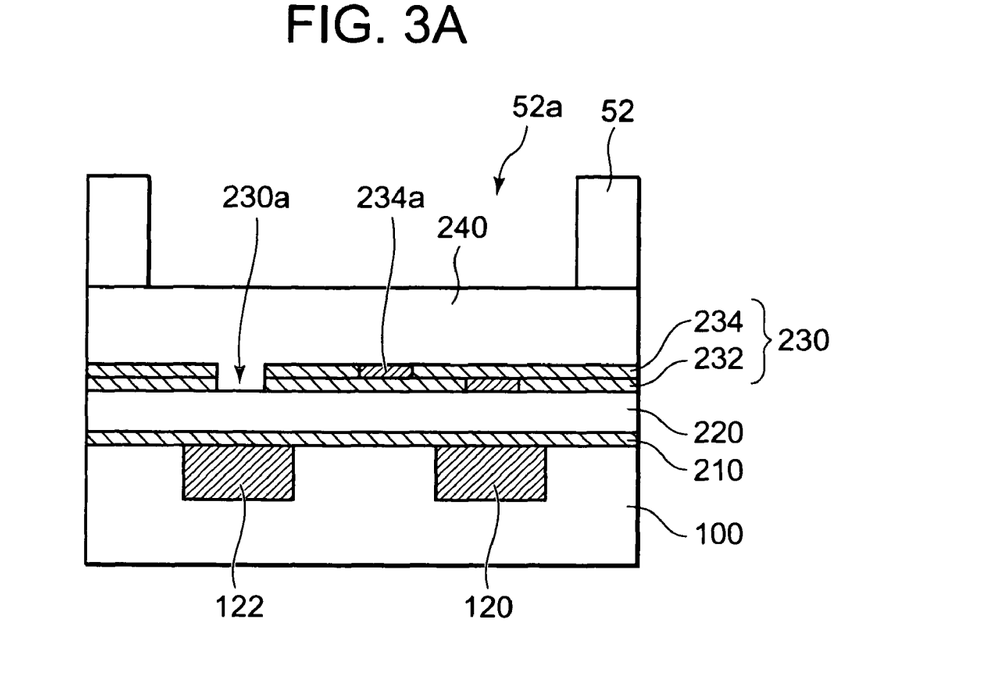
FIGS. 3A, 3B each are a sectional view showing the method for manufacturing a semiconductor device, according to the embodiment of the present invention.

Subsequently, the mask pattern 52 is formed over the interconnect interlayer dielectric 240, as shown in FIG. 3A. The mask pattern 52 has the opening pattern 52a. The opening pattern 52a is larger in size than the opening pattern 230a, and is positioned above the opening pattern 230a. Further, the opening pattern 52a is also positioned above the interconnect 122.

Figure 3B:
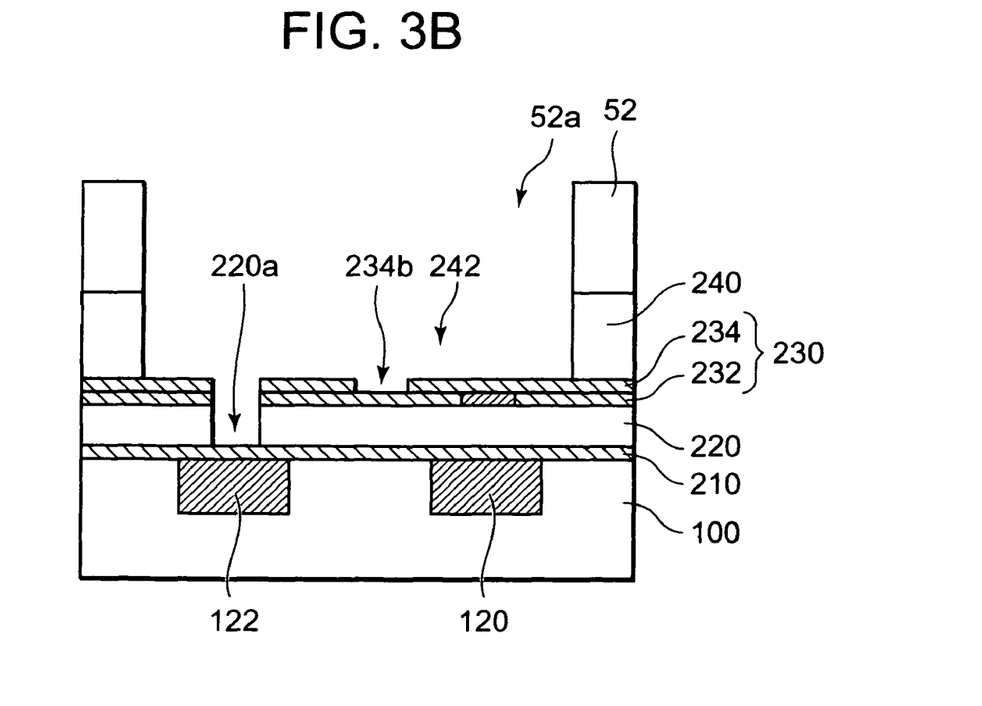

Subsequently, as shown in FIG. 3B, the interconnect interlayer dielectric 240 is etched with the use of the mask pattern 52 serving as a mask. By so doing, the groove 242 positioned under the opening pattern 52a is formed in the interconnect interlayer dielectric 240. With the present embodiment, the groove 242 is an interconnect groove, and is positioned above the interconnects 120, 122, respectively.

Thereafter, etching is continued. As a result, a portion of the via interlayer dielectric 220, positioned under the opening pattern 230a, is etched, thereby forming the connection hole 220a. The connection hole 220a is formed in such a way as to connect the underside of the groove 242 to the interconnect 122. In this process step, the high etching rate region 234a of the second film 234 as a constituent of the etching stopper film 230 is removed, thereby forming a groove 234b; however, a probability of a portion of the first film 232, positioned under the groove 234b, being the high etching rate region 232a is low. For this reason, in this process step, the formation of an unintended opening in the etching stopper film 230 can be prevented.

Figure 4A:
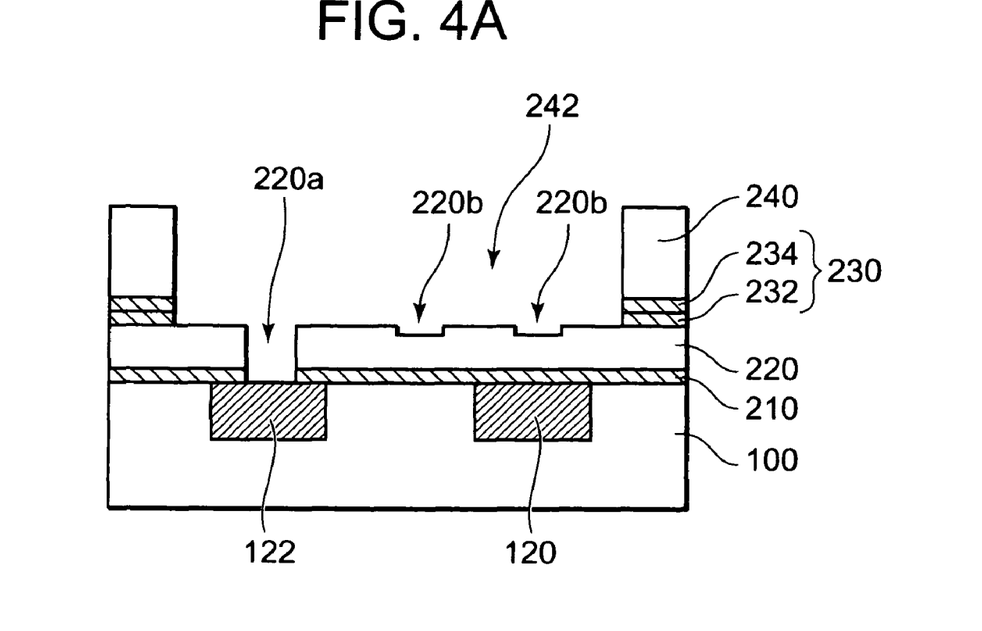
FIGS. 4A, 4B each are a sectional view showing the method for manufacturing a semiconductor device, according to the embodiment of the present invention.

Subsequently, a portion of the etching stopper film 210, positioned at the bottom of the connection hole 220a, is removed, as shown in FIG. 4A. In this process step, respective portions of both the first film 232 and the second film 234 of the etching stopper film 230, positioned at the bottom of the connection hole 220a, are also removed. Further, a recess 220b is formed in portions of the surface of the via interlayer dielectric 220, positioned under the high etching rate region 232a of the first film 232, and the high etching rate region 234a of the second film 234, respectively.

Figure 4B:
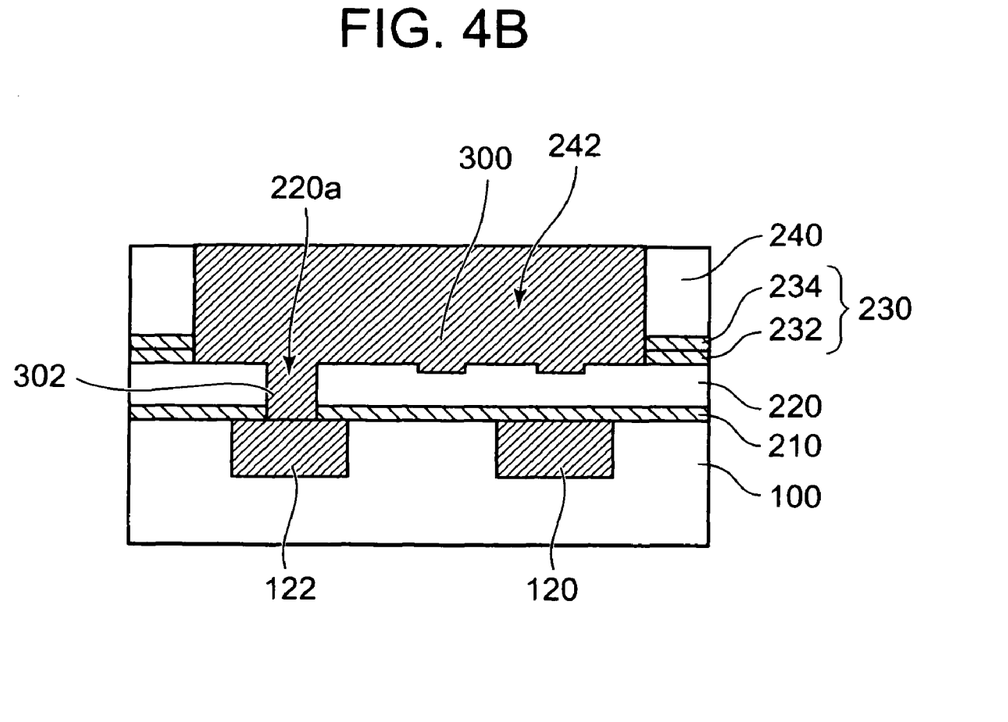

Subsequently, as shown in FIG. 4B, a barrier metal film (not shown) and a seed-Cu film (not shown) are formed on side faces as well as the underside of the groove 242, side faces as well as the underside of the connection hole 220a, and over the interconnect interlayer dielectric 240. Then, plating using the seed-Cu film serving as seeds is applied to thereby form a Cu film inside the groove 242, and the connection hole 220a, respectively, and over the interconnect interlayer dielectric 240. Subsequently, the Cu film, the seed-Cu film, and the barrier metal film, present over the interconnect interlayer dielectric 240, are removed by CMP (Chemical Mechanical Polishing). By so doing, there are formed an interconnect 300 positioned inside the groove 242, and a via 302 positioned inside the connection hole 220a.

Now, operation effects of the present invention are described hereinafter. The etching stopper film 230 is formed of the first film 232 and the second film 234, and the possibility of the high etching rate regions 232a, 234a overlapping each other is not strong. Accordingly, an unintended opening is prevented from being formed in the etching stopper film 230 in the process step of forming the groove 242, and the connection hole 220a. Therefore, formation of an unintended pin hole in the via interlayer dielectric 220 can be prevented.

Accordingly, even if the interconnect 300 is embedded in the groove 242, and the connection hole 220a, it is possible to prevent the interconnect 300 from coming into contact with unintended parts. For example, in the case where the groove 242 is positioned above the interconnect 120 as well, it is possible to prevent the interconnect 300 from coming into contact with not only the interconnect 122 but also the interconnect 120. In consequence, the yield of a semiconductor device will improve.

Further, because there is no need for modifying the available process except that the etching stopper film 230 is formed by at least two steps of processing, it is unnecessary to alter manufacturing conditions such as process parameters and so forth. Furthermore, deterioration in productivity can be prevented.

Furthermore, the constituent materials of the first film 232, and the second film 234, making up the etching stopper film 230, are identical in quality to each other. Accordingly, the etching stopper film 230 can be rendered the same in respect of film thickness and constituent material as an etching stopper film 230 of a single-layer structure, so that it is possible to prevent electrical characteristics from undergoing a change attributable to the etching stopper film 230.

Further, in those figures described in the foregoing, a double-layer structure is adopted for the etching stopper film 230; however, a structure of triple or more layers may be adopted instead. Even in this case, respective layers are formed of materials identical in quality to each other.

Having described the embodiment of the present invention with reference to the accompanying drawings, as above, it is to be pointed out that such description is for illustrative purposes only, and various other configurations can be adopted.

What is claimed is:

1. A semiconductor device, comprising:
   a first electrically conductive pattern;
   a first interlayer dielectric positioned over the first electrically conductive pattern;
   an etching stopper film comprising at least two films each comprising nitrogen and constituent materials identical in quality to each other, respectively, deposited on one another, and positioned on top of the first interlayer dielectric;
   a second interlayer dielectric positioned over the etching stopper film;
   an interconnect groove formed in the second interlayer dielectric, and positioned above the first electrically conductive pattern, a portion of the etching stopper film being exposed to a bottom of the interconnect groove;
   a connection hole formed in the first interlayer dielectric and the etching stopper film to connect an underside of the interconnect groove to the first electrically conductive pattern; and
   a second electrically conductive pattern embedded in the connection hole and the interconnect groove.

2. The semiconductor device according to claim 1, further comprising a third electrically conductive pattern positioned in the same layer where the first electrically conductive pattern is positioned, the first interlayer dielectric and the second electrically conductive pattern being formed above the third electrically conductive pattern.

3. The semiconductor device according to claim 2, wherein a signal different from a signal for the third electrically conductive pattern is inputted to the first electrically conductive pattern.

4. The semiconductor device according to claim 1, wherein said at least two films of the etching stopper film comprise SiCN.

5. The semiconductor device according to claim 1, wherein said at least two films of the etching stopper film comprise SiON.

6. The semiconductor device according to claim 1, wherein a film of said at least two films of the etching stopper film is disposed on top of an oxidation film of another film of said at least two films of the etching stopper film.

7. The semiconductor device according to claim 1, further comprising:

a single-layer etching stopper film disposed between the first interlayer dielectric and the first electrically conductive pattern.

8. The semiconductor device according to claim 7, wherein an upper surface of the single-layer etching stopper film contacts a lower surface of the first interlayer dielectric, and a lower surface of the single-layer etching stopper film contacts an upper surface of the first electrically conductive pattern.

* * * * *